(12) United States Patent
Korrek

(10) Patent No.: US 8,744,805 B2
(45) Date of Patent: Jun. 3, 2014

(54) MONITORING SYSTEM

(75) Inventor: Andre Korrek, Marienmuenster (DE)

(73) Assignee: Phoenix Contact GmH & Co. KG (DE)

( * ) Notice: Subject to any disclaimer, the term of this patent is extended or adjusted under 35 U.S.C. 154(b) by 749 days.

(21) Appl. No.: 12/997,748

(22) PCT Filed: Jun. 23, 2009

(86) PCT No.: PCT/EP2009/004516
§ 371 (c)(1),
(2), (4) Date: Feb. 10, 2011

(87) PCT Pub. No.: WO2009/156122
PCT Pub. Date: Dec. 30, 2009

(65) Prior Publication Data
US 2011/0128046 A1    Jun. 2, 2011

(30) Foreign Application Priority Data

Jun. 26, 2008  (DE) .......................... 10 2008 029 948

(51) Int. Cl.
| H03K 17/00 | (2006.01) |
| G05B 19/048 | (2006.01) |
| G06F 11/30 | (2006.01) |
| G06F 17/40 | (2006.01) |
| G06F 19/00 | (2011.01) |

(52) U.S. Cl.
CPC .............. H03K 17/00 (2013.01); G05B 19/048 (2013.01); G06F 11/30 (2013.01); G06F 17/40 (2013.01); G06F 19/00 (2013.01)
USPC ............... 702/182; 370/228; 370/230; 702/1; 702/127; 702/187; 709/224

(58) Field of Classification Search
CPC .............. G01D 3/00; G01D 3/08; G01D 7/00; G01D 9/00; G01D 21/00; G05B 9/00; G05B 9/02; G05B 19/00; G05B 19/02; G05B 19/04; G05B 19/042; G05B 19/0428; G05B 19/48; G05B 2119/00; G05B 2219/20; G05B 2219/24; G05B 2219/24021; G05B 19/24024; G05B 2219/25; G05B 2219/25428; G06F 11/00; G06F 11/30; G06F 11/32; G06F 11/34; G06F 17/00; G06F 17/40; G06F 19/00; H03K 3/00; H03K 5/00; H03K 5/125; H03K 17/00; H03K 2005/00; H03K 2017/00
USPC ............ 73/432.1, 865.8, 865.9, 866.1, 866.3; 327/1, 50, 72; 361/1, 78; 370/216, 225, 370/228, 229, 230; 375/224; 700/1, 2, 3, 9, 700/90; 702/1, 127, 182, 187, 188; 709/223, 224; 710/100, 107; 714/1, 2, 714/3, 100, E11.001, E11.179; 726/2, 3
IPC ......... G01D 3/00,3/08, 7/00, 9/00, 21/00; G05B 9/00, 9/02, 19/00, 19/02, 19/04, 19/042, 19/0428, G05B 19/48, 2219/00, 2219/20, 2219/24, G05B 2219/24021, 19/24024, 2219/24127, G05B 2219/25, 2219/25428; G06F 11/00, G06F 11/30, 11/32, 11/34, 17/00, 17/40, G06F 19/00; H03K 3/00, 5/00, 5/125, 17/00, H03K 2005/00, 2017/00
See application file for complete search history.

(56) References Cited

U.S. PATENT DOCUMENTS

| 2,883,255 | A | * | 4/1959 | Anderson | ........................ 346/34 |
| 3,237,164 | A | * | 2/1966 | Evans | ............................. 340/3.9 |

(Continued)

FOREIGN PATENT DOCUMENTS

| DE | 19621384 A1 | 11/1996 |
| DE | 19913279 A1 | 9/2000 |

(Continued)

OTHER PUBLICATIONS

"International Search Report and Written Opinion for International Application No. PCT/EP2009/004516 dated Oct. 6, 2009", , Publisher: European Patent Office, Published in: DE.

(Continued)

Primary Examiner — Edward Cosimano
(74) Attorney, Agent, or Firm — Kaplen Breyer Schwarz & Ottesen, LLP

(57) ABSTRACT

The invention relates to a monitoring system, having an output module for generating a control signal in response to an input signal, a monitoring module for generating the input signal for the output module, an output device for outputting an output signal in response to the control signal, and a feedthrough device for preventing outputting of the output signal. According to the invention, the monitoring module is designed to instruct the feedthrough device to prevent outputting of the output signal when there is a deviation between the control signal and a control signal which is expected on the basis of the input signal.

20 Claims, 5 Drawing Sheets

(56) References Cited

U.S. PATENT DOCUMENTS

| | | | | |
|---|---|---|---|---|
| 3,337,773 | A | * | 8/1967 | McKenna et al. ............... 361/94 |
| 3,421,069 | A | * | 1/1969 | Minks ............................. 363/19 |
| 3,516,072 | A | * | 6/1970 | Wallace, Jr. .................... 702/188 |
| 3,522,588 | A | * | 8/1970 | Clarke, Jr. et al. ......... 340/12.12 |
| 3,530,389 | A | * | 9/1970 | Hogan et al. ...................... 330/9 |
| 4,773,070 | A | * | 9/1988 | Schumm et al. ............... 714/716 |
| 6,243,629 | B1 | | 6/2001 | Sugimoto et al. |
| 7,366,954 | B2 | * | 4/2008 | Ueno et al. ...................... 714/37 |
| 7,636,008 | B2 | * | 12/2009 | Kim ............................... 327/427 |
| 2005/0262404 | A1 | * | 11/2005 | Ueno et al. .................... 714/712 |
| 2008/0074160 | A1 | * | 3/2008 | Kim ............................... 327/199 |

FOREIGN PATENT DOCUMENTS

| | | |
|---|---|---|
| DE | 10008434 A1 | 9/2001 |
| DE | 102004061013 A1 | 7/2006 |
| DE | 10 2006 001 805 A1 | 7/2007 |
| DE | 19860358 A1 | 7/2008 |
| EP | 1 128 241 A2 | 8/2001 |
| EP | 1703346 A2 | 9/2006 |
| EP | 1 927 914 A2 | 6/2008 |
| JP | 9305223 A | 11/1997 |
| WO | 2007014725 A1 | 2/2007 |
| WO | 2007/124942 A1 | 11/2007 |
| WO | 2008/037495 A2 | 4/2008 |

OTHER PUBLICATIONS

"Related German Patent Application No. 10 2008 029 948.0-32 Office Action", Mar. 9, 2009, Publisher: Deutsches Patent- und Markenamt, Published in: DE.

"Related Japanese Patent Application No. 2011-515190 Office Action", Apr. 23, 2013, Publisher: JPO, Published in: JP.

* cited by examiner

MONITORING SYSTEM

FIELD OF THE INVENTION

The invention relates to a monitoring system for monitoring safety-relevant processes.

BACKGROUND OF THE INVENTION

A field bus is a known industrial communication system, used for data transfer systems, which connects numerous linked field devices, such as sensors, control elements, and/or actuators to a control device, wherein the devices which provide the actual connection to the bus are referred to as "bus users."

For a number of applications, the deterministics, i.e., the predetermination and immutability in the transfer of process data, are more important than the actual transfer speed itself. For example, field buses having users connected thereto are known, in which process data are cyclically transferred via a shared transmission channel for transferring process data between individual users, and thus for transmitting and receiving process data, in particular process input data, process output data, and control data. For this purpose, during predetermined data cycles it is common for a user which functions as a master to read protocol-specific data from field devices which are connected to slave users, and during each subsequent data cycle to write to field devices which are connected to slave users.

In many system applications, the data to be transferred are also safety-relevant data, at least in part, so that data transfer errors must be recognized as soon as possible, and upon recognition of an error a timely response must be made; for example, a field device, user, or (sub)system must be converted to a safe state. For transfer of safety-relevant data via a bus, essentially six error classes must be considered: repetition, loss, insertion, incorrect sequence, deletion, and delay of safety-relevant data. The transfer of these data must therefore be secure.

To ensure secure transfer of data, in particular safety-relevant process data, at least in such a way that the listed error classes may also be recognized when they are present, it is basically common practice to supplement the transferred data with additional control data, for example time stamps, user information, and/or check information such as cycle redundancy checks (CRCs). However, a major disadvantage is that the overhead to be transferred greatly increases compared to the user data to be transferred, thus reducing the protocol efficiency. This weakness is particularly serious when the number or frequency of safety-relevant user data items per user which must be transferred is low. Another disadvantage of previously known monitoring systems for safety-related data is that, in order to implement user-specific processes having safety-oriented outputs, at least two microcontrollers or complex hardware circuits are always necessary for processing complex protocol tasks.

SUMMARY OF THE INVENTION

The object of the present invention is to provide a concept by means of which the complexity of hardware, software, and qualification, and therefore the manufacturing costs, for field devices having safety-related outputs may be reduced.

The invention is based on the finding that the processing functions of an output module which controls an actuator having a risk potential may have a single-channel design, and may also be monitored by a separate monitoring module, for example a safety master module. If the monitoring module identifies a deviation from expected behavior or an irregularity in the processing operation, it is able to convert the entire system, which may comprise multiple output modules, for example multiple safety output modules, to a safe state. The output module(s) may be converted to the safe state, for example, independently of the particular processing unit, using an auxiliary channel which allows feedthrough of the monitoring module, and which is therefore referred to below as a "feedthrough device."

Thus, the safety function is distributed over the monitoring module (safety master) and the output module (safety output module). The safety master is assisted by the simple, inexpensive switch-off mechanism of the feedthrough device. In addition, it is advantageous for the functionality of the inventive concept to integrate the output enable pulse into the bus protocol, for example. By using a decentralized microprocessor it is also possible to integrate the control information for the monoflop, which enables or switches off an output of the output module or a suitable output device. The control information may, for example, be modulated into the data signal at specified times, thus allowing efficient control of the feedthrough device.

According to one aspect, the invention relates to a monitoring system having an output module for generating a control signal in response to an input signal, a monitoring module for generating the input signal for the output module, an output device for outputting an output signal in response to the control signal, and a feedthrough device for preventing or halting outputting of the output signal, wherein the monitoring module is designed to instruct the feedthrough device to prevent or halt outputting of the output signal when there is a deviation between the control signal and a control signal which is expected on the basis of the input signal.

According to one embodiment, the output module is designed to transmit the control signal to the monitoring module, wherein the monitoring module is designed to receive the control signal, and to transmit a feedthrough signal to the feedthrough device when there is a deviation.

According to one embodiment, the monitoring module and the output module or the feedthrough device are designed to communicate via a communication network, in particular via a communication bus.

According to one embodiment, the monitoring module is designed to generate an enabling signal and to transmit it to the output module if the control signal corresponds to the expected control signal, wherein the enabling signal indicates the enabling of the output signal.

According to one embodiment, the feedthrough device is situated in the monitoring module or in the output module.

According to one embodiment, the feedthrough device is situated in the output module, wherein the monitoring module is designed to transmit a feedthrough signal to the feedthrough device to prevent outputting of the output signal, and the feedthrough device is designed to prevent or halt outputting of the output signal in response to the feedthrough signal.

According to one embodiment, the monitoring module is designed to compare the control signal to the expected control signal in order to test the control signal for the presence of the deviation.

According to one embodiment, the output device includes, for example, a relay or an analogous output stage having a data path for receiving the control signal, and a power supply path for supplying the output device with electrical power, wherein the feedthrough device is designed to act to prevent outputting of the output signal on the data path or on the power supply path. The analogous output stage may be designed, for example, for a range between 4 mA and 20 mA, the output current of which is less than 3 mA in the event of an error.

According to one embodiment, the feedthrough device includes a monostable flip-flop, in particular a flip-flop or a monoflop, wherein the output device has a data path and a power supply path, and an output of the flip-flop is linked, in particular via an output transistor, to the data path or to the power supply path in order to act on the data path or the power supply path, in particular in response to a feedthrough signal which may be applied at an input of the flip-flop.

According to one embodiment, the feedthrough device is designed to convert the output device to a blocking mode in response to a feedthrough signal, in particular to switch off the output device, or interrupt the output thereof, or interrupt the data path or control signal path thereof, or disconnect the power supply thereof.

According to one embodiment, the output module includes a microcontroller which is provided to receive the input signal and to generate the control signal.

According to one embodiment, the monitoring module and the output module are separate modules.

The invention relates to a method for monitoring an output module using a monitoring module, wherein a control signal is generated by the output module in response to an input signal, and the input signal for the output module is generated by the monitoring module, wherein an output signal is output in response to the control signal, and outputting of the output signal is prevented by a feedthrough device when there is a deviation between the control signal and a control signal which is expected on the basis of the input signal. Further steps of the method for monitoring the output module result directly from the functionality of the monitoring module according to the invention.

BRIEF DESCRIPTION OF THE DRAWINGS

Further exemplary embodiments of the invention are explained in greater detail with reference to the accompanying drawings, which show the following.

DETAILED DESCRIPTION

Figure 1:
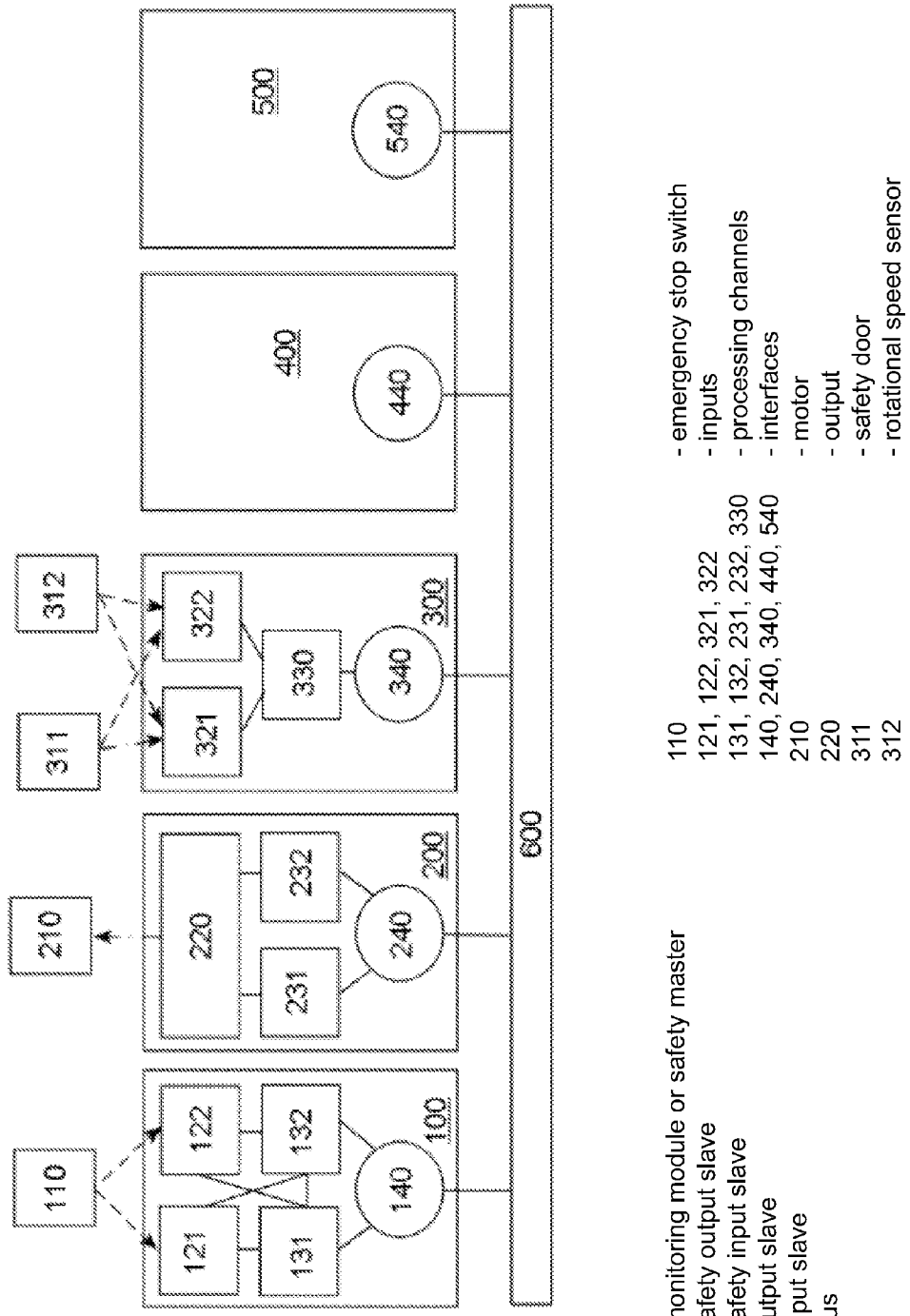
FIG. 1 shows a design principle of a monitoring system.

Reference is first made to FIG. 1, which shows a basic system design which may be used within the scope of the invention. From a topological standpoint the illustrated system design is configured as a line, although a star topology or any given mixed forms are also possible.

Five bus users connected to a bus 600 are shown. A first bus user is a monitoring module 100, for example a safety-related master, which is also referred to below as a safety master, and which in the present example at the same time is also the bus master, although this is not mandatory within the scope of the invention. In general, this may involve a given, appropriately specified safety user. A second bus user is a safety-related slave output user 200, also referred to below as an output module or safety output slave, and a third bus user is a safety-related slave input user 300, also referred to below as a safety input slave. A fourth bus user is a nonsafety-related slave output user 400, also referred to below as an output slave, and a fifth bus user is a nonsafety-related slave input user 500, also referred to below as an input slave. Security-related users, i.e., users which process safety-relevant process data, and non-safety-related users may thus be mixed and also positioned as desired.

With regard to the safety-related users of the system design illustrated by way of example, connected to the safety master 100 is an emergency stop switch 110, for example, the safety-relevant input information of which user 100 redundantly receives via two inputs 121 and 122, and, in a manner specific to the protocol, first processes same via two redundant processing channels 131 and 132 before the signal is coupled to bus 600. A motor 210, for example, is connected to the safety output slave 200, wherein, after decoupling of the signal from bus 600, in a manner specific to the protocol, user 200 first carries out processing via two redundant processing channels 231 and 232 and sends the safety-relevant output information to the motor 210 via an output 220. Connected to the safety input slave 300 are a safety door 311 and a rotational speed sensor 312, for example, the safety-relevant input information of which user 300 redundantly receives via two inputs 321 and 322, and, in a manner specific to the protocol, processes same via a processing channel 330 before the signal is coupled to bus 600.

A safety-related function is generally implemented by using redundant processing, for example by means of two separate channels on the hardware side, wherein the particular interface 140, 240, 340, 440, or 540 of a user for bus 600 is generally implemented only as a single channel. In addition to reducing the required space and the cost, it is also possible to operate with twice the number of users on the bus, in particular with regard to bus load, current consumption, and capacitance. Errors caused by the bus coupling, for example those based on line drivers or galvanic insulation, may typically be recognized by the line protocol used. However, the processing unit of the safety-related users does not necessarily have to have a dual-channel design on the hardware side; in many cases it is sufficient for the software to have a dual-channel design.

Bus 600 then provides the shared data line for the method according to the invention and the transfer system for transmitting and receiving all data, in particular process data. Such a transfer system operates based, for example, on a local interconnect network (LIN) bus known from automotive technology, in which during certain data cycles protocol-specific data may be read out by a master from field devices connected via users, and during each subsequent data cycle may be written into the field devices at approximately 19.2 to 38 kBd.

In one method according to the invention by way of example, process input and process output data are also transferred, for example, at a fixed interval, each shifted by the time of one-half bus cycle. Thus, a transfer protocol for a cyclical transfer of process input and process output data, for example, frequently uses two different data exchange services, also referred to below as data exchange mode. In this case, a bus cycle therefore includes a data cycle based on a PD read service and a subsequent data cycle based on a PD write service.

For the transfer of process output data, for the PD write service a master transmits to the users connected to the master basically all data for the connected field devices, and then determines a cyclic redundancy check (CRC), which it also transfers. The transfer system is advantageously designed in such a way that all connected users also read all information transferred in this manner, and preferably likewise form a CRC, which they compare to the received CRC of the master, so that an error message is generated in the event of an error, and selected users or individual field devices, for example, are converted to a safe state. For transfer of the process input data, for a PD read service the master first transmits, for example, a broadcast address, followed by a function code. The other connected users then apply data from their connected field devices, i.e., in particular their process input data, bit for bit to the data line in respectively provided time slots. In one preferred design, by tracking on the data line the users are in turn able to recognize all data and once again compute a CRC.

Figure 2:
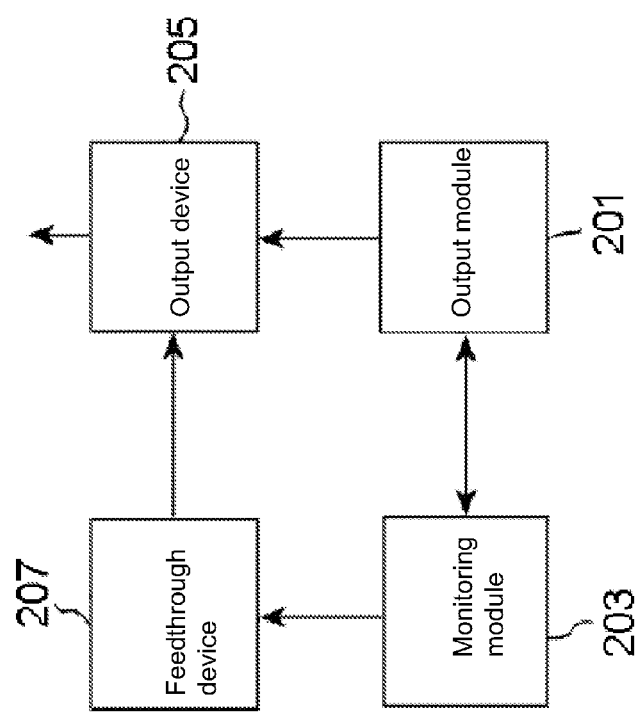
FIG. 2 shows a block diagram of a monitoring system.

FIG. 2 shows a block diagram of a monitoring system having an output module 201, and a monitoring module 203 which is in bidirectional connection with the output module 201. The monitoring system also includes an output device 205 connected downstream from the output module 201, and a feedthrough device 207 connected downstream from the monitoring module 203 and whose output is connected to the output device 205. The output device 205 includes an output for outputting an output signal in response to a control signal generated by the output module 201 on the basis of an input signal supplied by the monitoring module 203. Beforehand, the output module 201 transmits the control signal to the monitoring module 203 for checking, and the monitoring module checks the control signal for deviation from an expected control signal. If there is a deviation, which for example exceeds a predetermined threshold value, the monitoring module 203 instructs the feedthrough device 207, for example via a feedthrough signal, to prevent outputting of the output signal. The feedthrough device 207 acts, for example, directly on the output device 205, and interrupts, for example, the power supply or the control path or data path of the output device in order to prevent outputting of the output signal.

Modules 201, 203, 205, and 207 do not necessarily have to be implemented in spatially separate designs. They may also be implemented on a printed circuit board. Instead of the bus system, a separate connection, for example over gaps, may be provided for communication.

Figure 3:
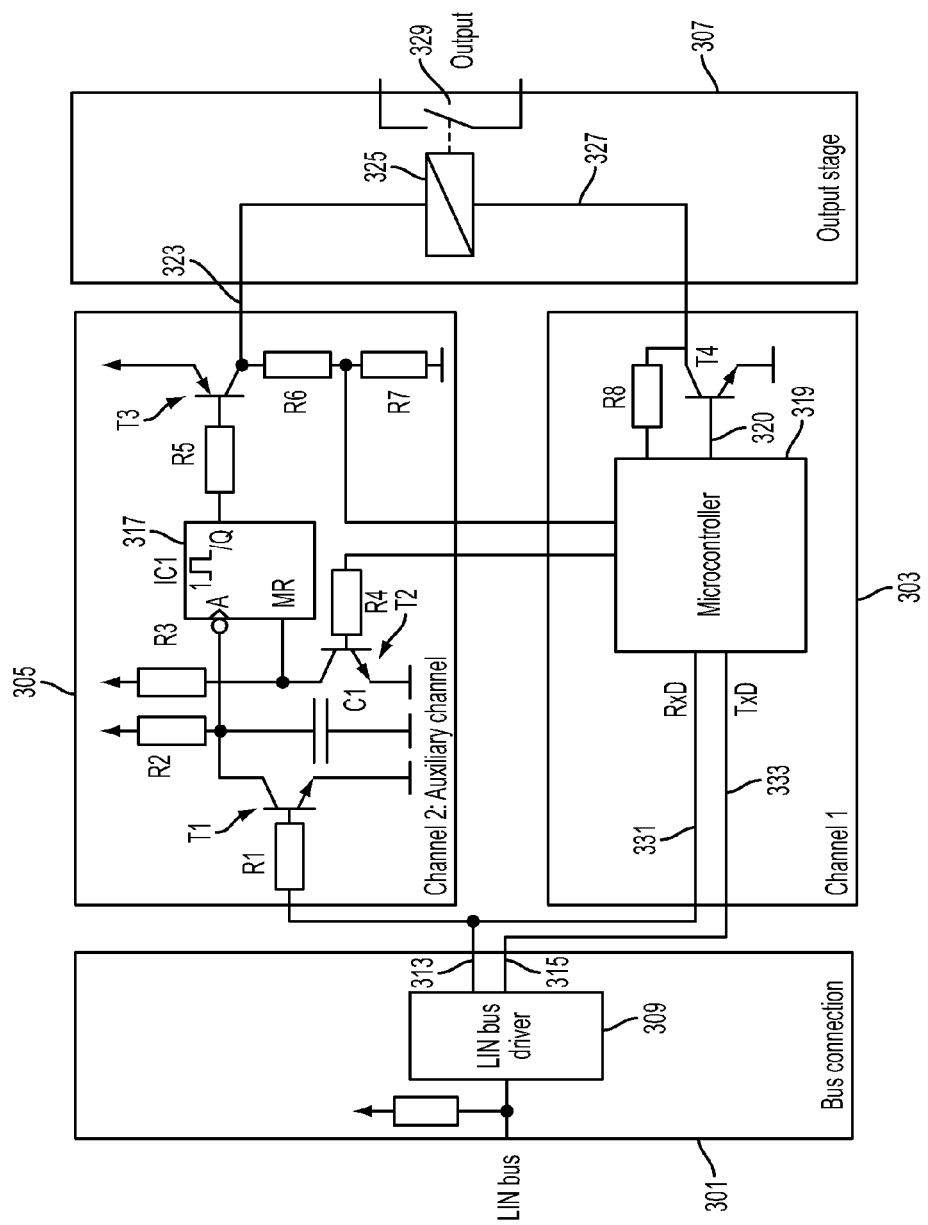
FIG. 3 shows a block diagram of an output module.

FIG. 3 shows an output module having a bus coupling 301, a microcontroller switching circuit 303, a feedthrough device 305, and an output device 307. The bus coupling 301 includes an input to which a LIN bus, for example, may be coupled. The input is connected to a LIN bus driver 309 which has two terminals 313 and 315. Terminal 313 is connected via an input resistor $R_1$ of feedthrough device 305 to a gate terminal of a transistor $T_1$ of feedthrough device 305. Transistor $T_1$ also has a first terminal, for example an emitter terminal, which is connected to ground. A second terminal of transistor $T_1$, for example a collector terminal, is connected to a clock input A of a flip-flop 317, for example a monoflop. The second output of transistor $T_1$ is connected to ground via a capacitor $C_1$, and to a supply potential via a resistor $R_2$.

Flip-flop 317 also includes a data input MR which is connected to a second terminal, for example a collector terminal, of a second transistor $T_2$. On the other hand, a first terminal of transistor $T_2$, for example an emitter terminal, is connected to ground. Data input MR may also be connected to a supply potential via a resistor $R_3$. A gate terminal of transistor $T_2$ is connected via a resistor $R_4$ to a terminal of the microcontroller 319 of microcontroller switching circuit 303. An output Q of flip-flop 317 is connected via a resistor $R_5$ to a gate terminal of a third transistor $T_3$, whose first terminal, for example an emitter terminal, may be connected to a supply potential, and whose second terminal is connected via a resistor $R_6$ to a further terminal of the microcontroller 319. Resistor $R_6$ is connected to ground via a resistor $R_7$. At the same time, the second terminal of third transistor $T_3$ forms an output 323 of feedthrough device 305, which is connected, for example, to a power supply input of a relay 325 of output device 307. The relay 325 includes a further path 327, which may be a data path or control path, for example. The relay 325 is also coupled to a switch 329. The switch 329 bridges two contacts as a function of a relay state, it being possible to output an output signal only in the closed state of the switch.

The data path 327 of the relay 325 is connected to a second terminal of a transistor $T_4$, for example to a collector terminal. Transistor $T_4$ also includes a first terminal, for example an emitter terminal, which is connected to ground. An output 320 of the microcontroller 319 is connected to a gate of transistor $T_4$. A further terminal of the microcontroller 319 is also connected via a resistor R8 to the second terminal of transistor $T_4$.

The terminal 313 of bus driver 309 is also connected to an input terminal 331 of the microcontroller 319. On the other hand, an output terminal 333 of the microcontroller is connected to terminal 315. The microcontroller 319 receives data, for example an input signal, via input terminal 331 from a monitoring module (not illustrated in FIG. 3), and on this basis generates a control signal which is delivered to relay 325 via data path 327, for example. Beforehand, however, the microcontroller 319 transmits the control signal to the monitoring module (not illustrated) via output terminal 333. The monitoring module checks whether the control signal corresponds to an expected control signal, for example on the basis of the input signal, i.e., the input data. If there is a deviation, which for example exceeds a threshold value, the monitoring module transmits a feedthrough signal via terminal 313 of driver 309 to feedthrough device 305, on the basis of which, for example, the power supply to the relay 325 is interrupted, thereby preventing or halting the closing of switch 329. The outputting of the output signal is prevented in this manner.

The structure of the output module illustrated in FIG. 3 is based on a dual-channel design. The first channel is formed by the microcontroller circuit 303, while the feedthrough device 305 may be understood to be a second channel, for example as an auxiliary channel. Channel 2, i.e., feedthrough device 305, of the output module is not necessarily designed as a complete channel. The actual safety function is implemented, for example, by the microcontroller 319 of microcontroller circuit 303. The microcontroller 319 may also be provided to realize the functional implementation of the bus protocol, wherein the physical bus coupling may be established, for example, by the LIN bus driver 309 illustrated in FIG. 3.

After a protocol frame, for example, has been correctly received and all process data channels (PDC) have passed the plausibility checks, the processing of the safety function using the received data may begin. Via transistor $T_4$ the microcontroller 319 controls the output device 307 (output stage), which by way of example may have a relay. Resistor $R_8$ is used for monitoring the output stage 307, and by means of the microcontroller 319 a monitoring result is posted in the next data cycle as a safety PDC. Based on the known safety functions and the input data or input signals, the monitoring module (not illustrated in FIG. 3) is able to check the microcontroller 319 and its output. If a deviation is identified, the monitoring module switches the system to a safe state, using the superimposed safety mechanism which is implemented by the feedthrough device 305. The power supply to the output stage, for example, may be switched off in this manner.

As an alternative to the illustrated relay, for example an analogous output stage may be used which is designed, for example, for a range between 4 mA and 20 mA, the output current of the output stage in the event of an error being less than 3 mA.

Figure 4:
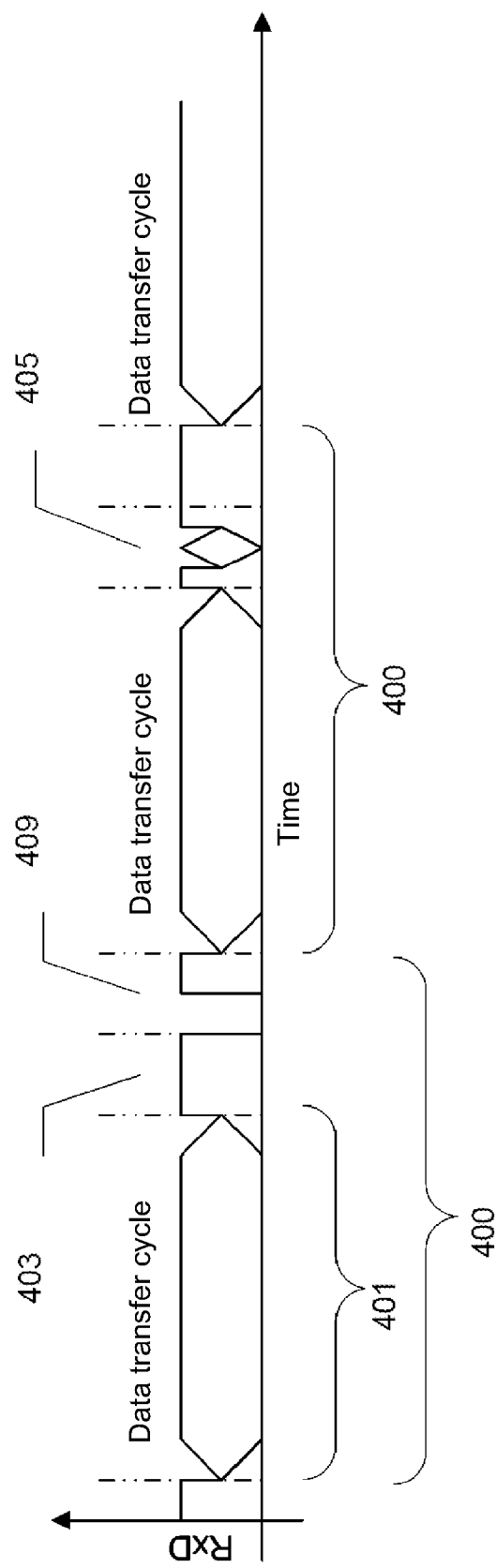
FIG. 4 shows a data frame structure.

FIG. 4 shows an example of bus timing, using a transfer cycle 400 which may be divided into three phases. User data are transferred in the first phase 401. The second phase 403 is used for data checking on the frame and PDC levels. For example, if none of the users finds an error, the data signal of the LIN bus remains in the high-level state, which corresponds to "high." If an error is detected, the applicable user sends an error code as illustrated with reference to data section 405. If no error has been detected in the entire transfer and processing cycle, including checking of the output states of the safety outputs, the monitoring module, i.e., the master, generates an enabling signal for the outputs which is evaluated by the monoflop 317 from FIG. 3. The data checking takes place in section 403, for example. The output enabling is indicated by section 409.

The monoflop 317 (IC 1) is retriggerable with a monoflop trigger time of 30 ms. For example, the monoflop may be triggered only when the bus signal, for at least 700 µs, for example, assumes a low-level state, referred to as "low," represented by the output enabling 409. However, this is not ensured during a data transfer having a baud rate of at least 14,400 baud, since at least one logical "1" is forced as a result of the transfer of one stop at the end of each character. The quiescent level of the LIN bus is likewise a logical "1," so that a longer period of bus inactivity does not result in triggering.

As a result of the "1" level on the LIN bus, transistor $T_1$ illustrated in FIG. 3 is switched through, which prevents or halts charging of capacitor $C_1$, so that a negative flank cannot appear at the input of monoflop 317. Only a logical "low" blocks the transistor, and causes capacitor $C_1$ to be charged by resistor $R_2$. After approximately 700 µs, capacitor $C_1$ is charged to above the "high" switching level of monoflop 317, for example, so that a change of the LIN bus signal from "low" to "high" generates a triggering flank at monoflop 317. Output/Q is then switched to "low," resulting in enabling of the output stage 307. The microcontroller is able to check switching transistor $T_4$ via resistor $R_8$. The voltage divider, including resistors $R_6$ and $R_7$, is used to check the feedthrough device 305, which is implemented as an auxiliary channel, for example. For the checking it may be advantageous to reset the monoflop 317 via transistor $T_2$, resulting in blockage of transistor $T_3$ and therefore shutting off output stage 307. The power supply to relay 325, for example, may be disconnected in this manner.

Figure 5:
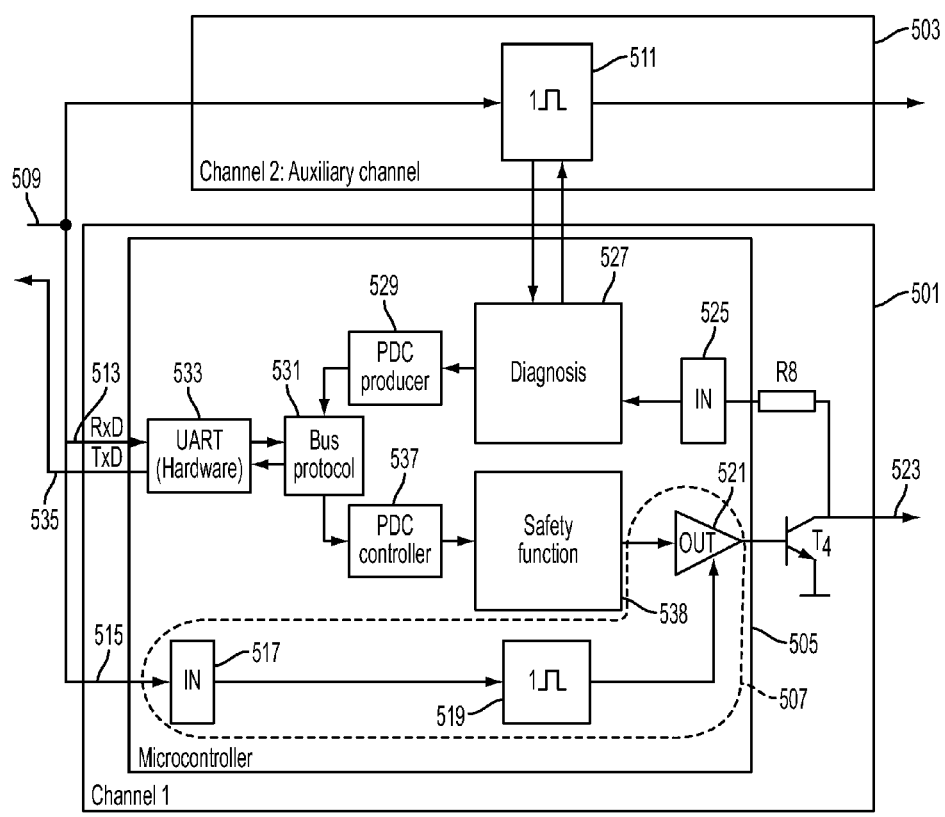
FIG. 5 shows a block diagram of an output module.

FIG. 5 shows a block diagram of an output module having a microcontroller circuit 501 and a feedthrough device 503. The microcontroller circuit 501 includes a microcontroller 505 having an additional feedthrough device 507. An input 509 of the output module is connected to a flip-flop 511, for example a monoflop, of the feedthrough device 503. The flip-flop 511 also has an output, which may be coupled, for example, to an output device (not illustrated in FIG. 5).

Input 509 is also connected to a receiving input 513 of the microcontroller 505 and to an input 515 of the additional feedthrough device 507. The feedthrough device includes an input component 517 which is connected to an input of a flip-flop 519, for example a monoflop. An output of the flip-flop 519 is connected to a terminal of an output driver 521, for example an operational amplifier, of the additional feedthrough device 507. An output of the output driver 521 is connected to a gate of a transistor $T_4$, whose second terminal, for example a collector terminal, forms an output 523 of the microcontroller circuit 501. On the other hand, a first terminal of transistor $T_4$, for example a emitter terminal, is connected to ground. The second terminal of transistor $T_4$ is connected via a resistor R8 to an input element 525, for example an input driver, of the microcontroller 505 by means of a feedback loop. An output of the input element 525 is connected to a diagnostic element 527 which is connected to flip-flop 511, as illustrated in FIG. 5. An output of the diagnostic element 527 is connected to a PDC producer 529, whose output is connected to a bus element 531. The bus element 531 is also coupled to a universal asynchronous receiver/transmitter (UART) 533. As illustrated in FIG. 5, the receiving input 513 is connected to an input of the UART 533. The UART 533 also has an output 535, which forms an output of the microcontroller circuit 501. The bus protocol element 531 is coupled to a PDC consumer 537, whose output is connected to a safety function block 538. The safety function block 538 has an output which is connected to an input of the output element 521.

The additional feedthrough device 507 may be implemented as software, for example, while the feedthrough device 503 may be implemented as hardware. Further components implemented as hardware may be UART element 533 as well as input elements 517, 525 and output element 521. On the other hand, elements 527, 529, 531, 537, 519, and 538 may be implemented as software.

The main signal path of the safety function leads from UART block 533 through a protocol stack, which is implemented in the bus protocol element 531. Data exchange occurs between the bus protocol and the processing unit via two buffers 529 and 537, for example, whereby the input data of the safety function are stored in the consumer PDC buffer 537. Accordingly, the output data and status data are transferred by the producer buffer 529 to a monitoring module (not illustrated in FIG. 5).

As illustrated in FIG. 5, the output driver 521 of microcontroller 505 has two inputs, whereby the safety function uses only the data input or control input, for example. If the output driver 521 is released by the second input, this state is visible for transistor $T_4$. Monoflop 519 implements, for example, the same function as the feedthrough device 503, which may also be referred to as a second channel or an auxiliary channel, the difference being that it may be implemented almost completely as software, thus providing diversity.

As an alternative to the exemplary embodiment illustrated in FIG. 5, the feedthrough device 503 as well as its monoflop function may be implemented by a software function. This is particularly advantageous when a second microcontroller is used for more complex output modules.

What is claimed is:

1. A monitoring system, having:
    an output module for generating a control signal in response to an input signal;
    a monitoring module for generating the input signal for the output module;
    an output device for outputting an output signal in response to the control signal; and
    a feedthrough device for preventing the outputting of the output signal;
    wherein the monitoring module is designed to instruct the feedthrough device to prevent the outputting of the output signal when there is a deviation between the control signal and an expected control signal that is expected on the basis of the input signal.

2. The monitoring system according to claim 1, wherein the output module is designed to transmit the control signal to the monitoring module, wherein the monitoring module is designed to receive the control signal, and to transmit a feedthrough signal to the feedthrough device when there is a deviation.

3. The monitoring system according to claim 1, wherein the monitoring module and the output module or the feedthrough device are designed to communicate via a communication network.

4. The monitoring system according to claim 1, wherein the monitoring module is designed to generate an enabling signal and to transmit the enabling signal to the output module when the control signal corresponds to the expected control signal, and wherein the enabling signal indicates the enabling of the output signal.

5. The monitoring system according to claim 1, wherein the feedthrough device is situated in the monitoring module or in the output module.

6. The monitoring system according to claim 1, wherein the feedthrough device is situated in the output module, wherein the monitoring module is designed to transmit a feedthrough signal to the feedthrough device to prevent the outputting of the output signal, and wherein the feedthrough device is designed to prevent the outputting of the output signal in response to the feedthrough signal.

7. The monitoring system according to claim 1, wherein the monitoring module is designed to compare the control signal to the expected control signal in order to test the control signal for the presence of the deviation.

8. The monitoring system according to claim 1, wherein the output device has a relay or an analogous output stage having a data path for receiving the control signal, and a power supply path for supplying the output device with electrical power, and wherein the feedthrough device is designed to act to prevent the outputting of the output signal on the data path or on the power supply path.

9. The monitoring system according to claim 1, wherein the feedthrough device is designed to convert the output device to a blocking mode in response to a feedthrough signal.

10. The monitoring system according to claim 1, wherein the output module has a microcontroller that is provided to receive the input signal and to generate the control signal.

11. The monitoring system according to claim 1, wherein the monitoring module and the output module are separate modules.

12. The monitoring system according to claim 1, wherein the monitoring module and the output module or the feedthrough device are designed to communicate via a communication bus.

13. The monitoring system according to claim 1, wherein the feedthrough device is designed to convert the output device to a blocking mode in response to a feedthrough signal so as to switch off the output device.

14. The monitoring system according to claim 1, wherein the feedthrough device is designed to convert the output device to a blocking mode in response to a feedthrough signal so as to interrupt the output thereof.

15. The monitoring system according to claim 1, wherein the feedthrough device is designed to convert the output device to a blocking mode in response to a feedthrough signal so as to interrupt a data path thereof.

16. The monitoring system according to claim 1, wherein the feedthrough device is designed to convert the output device to a blocking mode in response to a feedthrough signal so as to disconnect a power supply thereof.

17. The monitoring system according to claim 1, wherein the feedthrough device has a monostable flip-flop, wherein the output device has a data path and a power supply path, and an output of the monostable flip-flop is linked to the data path or to the power supply path in order to act on the data path or the power supply path.

18. The monitoring system according to claim 17, wherein the output of the monostable flip-flop is linked to the data path or to the power supply path via an output transistor.

19. The monitoring system according to claim 17, wherein the output of the monostable flip-flop is linked to the data path or to the power supply path in order to act on the data path or the power supply path in response to a feedthrough signal when applied at an input of the monostable flip-flop.

20. A method for monitoring an output module using a monitoring module, having:
    generating, by the output module, a control signal in response to an input signal;
    generating, by the monitoring module, the input signal for the output module; and
    outputting an output signal in response to the control signal, wherein the outputting of the output signal is prevented by a feedthrough device when there is a deviation between the control signal and an expected control signal that is expected on the basis of the input signal.

* * * * *